United States Patent
Kudo et al.

(10) Patent No.: US 7,554,186 B2
(45) Date of Patent: Jun. 30, 2009

(54) SEMICONDUCTOR DEVICE

(75) Inventors: Mamoru Kudo, Kanagawa (JP);
Kenichi Shigenami, Kanagawa (JP);
Shunichi Sukegawa, Ibaraki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/110,682

(22) Filed: Apr. 28, 2008

(65) Prior Publication Data

US 2008/0315386 A1    Dec. 25, 2008

(30) Foreign Application Priority Data

Jun. 22, 2007    (JP)    ............... 2007-165202

(51) Int. Cl.
*H01L 23/50*    (2006.01)
(52) U.S. Cl. .............................. 257/686; 257/E23.078; 257/E23.079
(58) Field of Classification Search ................ 257/686, 257/E23.078, E23.079
See application file for complete search history.

(56) References Cited

U.S. PATENT DOCUMENTS

| | | | |
|---|---|---|---|
| 6,798,072 B2 | 9/2004 | Kajiwara et al. | |
| 7,339,275 B2 * | 3/2008 | Wang et al. | 257/777 |
| 2008/0265367 A1 * | 10/2008 | Tan et al. | 257/531 |

FOREIGN PATENT DOCUMENTS

JP    2002-151551    5/2002

* cited by examiner

*Primary Examiner*—Trung Dang
(74) *Attorney, Agent, or Firm*—Oblon, Spivak, McClelland, Maier & Neustadt, P.C.

(57) ABSTRACT

A semiconductor device includes a first semiconductor package, a second semiconductor package. The first semiconductor package includes a first semiconductor package base having a first cavity formed therein, a first mount component mounted in the first cavity, and a first magnet disposed on the first semiconductor package base. The second semiconductor package includes a second semiconductor package base having a second cavity formed therein, a second mount component mounted in the second cavity, and a second magnet disposed on the second semiconductor package base so as to adsorb the first magnet. The first semiconductor package and the second semiconductor package are stacked by an adsorption of magnetic force between the first magnet and the second magnet.

18 Claims, 9 Drawing Sheets

1

SEMICONDUCTOR DEVICE

CROSS-REFERENCE TO RELATED APPLICATIONS

The present application claims benefit of priority of Japanese patent Application No. 2007-165202 filed in the Japanese Patent Office on Jun. 22, 2007, the entire disclosure of which is incorporated herein by reference.

FIELD OF THE INVENTION

The present invention relates to a semiconductor device, and more specifically to a semiconductor device having readily replaceable or addable semiconductor packages.

DESCRIPTION OF RELATED ART

Electronic components, such as ICs represented by LSI, resistors, capacitors, semiconductor elements such as diodes and so forth, which are to be mounted on a semiconductor substrate, have arbitrarily been contained to meet application and functional requirements.

With advancement in functions of system, the number of the electronic components to be mounted on a semiconductor substrate has been increased, and the electronic components have been coupled each other with complexity, so that area of the semiconductor substrate on which the electronic components are mounted has increased.

To manufacture semiconductor devices having advanced functions without increasing the area of semiconductor substrate for mounting, the electronic components are stacked and mounted on the semiconductor substrate to manufacture the semiconductor devices. In such manufacturing of the semiconductor devices by stacking the electronic components, electrical connection and fixation of the electronic components are accomplished by bonding using solder, for example (see Patent Unexamined Patent Application Publication No. 2002-151551 (Patent Document 1).

SUMMARY OF THE INVENTION

However, if the electronic components as the constituents are fixed and stacked using solder or the like, the electronic components may not readily be replaced when they are out of order, or may not readily be exchanged or added for the purpose of functional modification of the semiconductor devices.

Accordingly, it is desirable to provide a semiconductor device having semiconductor packages stacked therein, allowing easy attachment and detachment of the semiconductor packages.

In accordance with an embodiment of the present invention, there is provided a semiconductor device including a first semiconductor package and a second semiconductor package. The first semiconductor package includes a first semiconductor package base having a first cavity formed therein, a first mount component mounted in the first cavity, and a first magnet disposed on the first semiconductor so as to align a magnetic surface thereof in parallel with a surface on which the first mount component is mounted. The second semiconductor package includes a second semiconductor package base having a second cavity formed therein, a second mount component mounted in the second cavity, and a second magnet disposed on the second semiconductor package base so as to align a magnetic surface thereof in parallel with a surface on which the second mount component is mounted. The first magnet and the second semiconductor magnet are adsorbed so that the first semiconductor package and the second semiconductor package are stacked.

The semiconductor packages are fixed by magnets disposed therebetween, so that it is easy to detach the semiconductor packages. A new semiconductor package may also readily be added to the semiconductor packages fixed by the magnets.

According to an embodiment of the present invention, there is provided a semiconductor device having the semiconductor packages stacked therein, allowing easy attachment and detachment of the semiconductor packages.

The above summary of the present invention is not intended to describe each illustrated embodiment or every implementation of the present invention. The figures and the detailed description which follow more particularly exemplify these embodiments.

DETAILED DESCRIPTION OF EMBODIMENTS

Paragraphs below will describe embodiments of the semiconductor device according to an embodiment of the present invention, referring to the attached drawings.

First Embodiment

Figure 1:
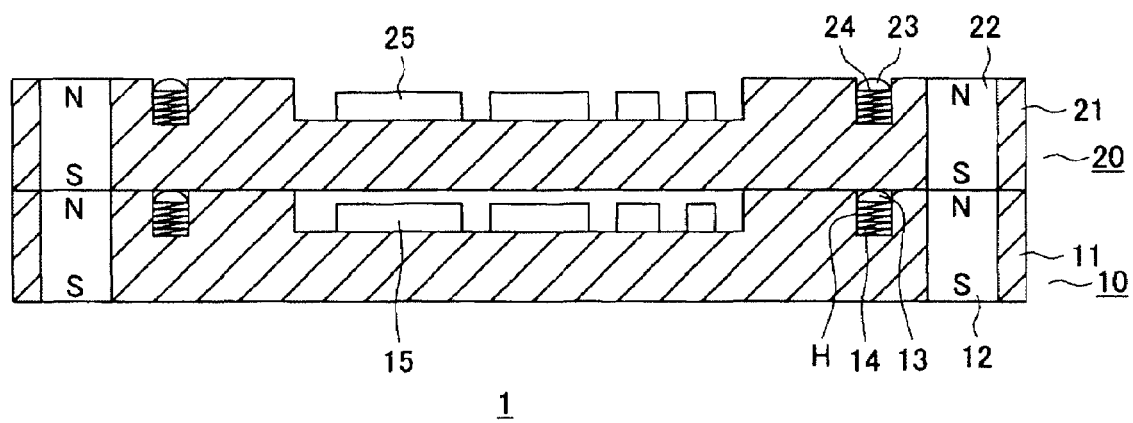
FIG. 1 is a sectional view showing a semiconductor device according to one embodiment of the present invention.

FIG. 1 is a sectional view of a semiconductor device according to one embodiment of the present invention.

As shown in FIG. 1, a semiconductor device 1 according to one embodiment of the present invention, for example, includes semiconductor packages 10, 20.

The semiconductor package 10, for example, includes a semiconductor package base 11, magnets 12, contact points 13, elastic member 14, and mount components 15. The semiconductor package 20, for example, includes a semiconductor package base 21, magnets 22, contact points 23, elastic member 24, and mount components 25.

The semiconductor package base 11 may be composed of an arbitrary material, and may be composed of resins such as glass epoxy and silicone, or ceramics. The semiconductor package base 11 has a cavity formed in the center thereof. The mount components 15 adapted to applications and functions of the semiconductor package 10 are mounted in the cavity. The semiconductor package 10 has interconnections (not shown) formed therein, so as to electrically connect the mount components 15 respectively. The semiconductor package base 11 may be of various sizes according to applications of the semiconductor package 10, number of mount components 15, or the like.

The magnets 12 are disposed to be exposed to the surface of the semiconductor package base 11 or to be buried inside the semiconductor package base 11, so as to adsorb the magnets 22 disposed in the semiconductor package 20. Preferably, the magnets 12 are disposed to be exposed to the surface of the semiconductor package base 11, for example, so as to direct the end face of the magnetic pole of the magnets 12 toward the direction in which the semiconductor package base 21 is stacked, and penetrate the semiconductor package base 11. The "magnetic pole" used herein means a portion where the magnetic field generated by the magnets is strongest. Alternatively, the magnets 12 may be disposed to be buried in the surface of the semiconductor package base 11. A single magnet, or a plurality of magnets 12 may be disposed, wherein, for example, the direction of poles of magnets 12 11 may be different from each other, or the directions of poles of all magnets 12 may be same, in one surface of the semiconductor package base 11.

Size of the magnets 12 may differ depending on size of the semiconductor package base 11 on which the magnets 12 are formed, and depending on necessary level of adsorptive force of magnets, and may be approximately 2 mm to 3 mm in diameter when the semiconductor package base 11 is approximately 5 cm wide.

The magnets 12 are, for example, neodymium magnets, samarium-cobalt magnets, ferrite magnets or the like, and preferably neodymium magnets or samarium-cobalt magnets which have a large adsorptive force. For example, a neodymium magnet of 3 mm in diameter and 3 mm in height has an adsorptive force of approximately 350 gf, and a samarium-cobalt magnet of 3 mm in diameter and 3 mm in height has an adsorptive force of approximately 150 gf.

The number of magnets 12 disposed on the semiconductor package base 11 is determined depending on the adsorptive force of the magnets 12, elasticity of the elastic member 14 formed in the semiconductor package base 11, and the number of elastic member 14. It would be desirable that the adsorptive force of magnets 12 is larger than (elasticity of elastic member 14)×(number of elastic member 14). For example, assuming that the elastic member 14 has an elasticity of 3 gf, and the number of the elastic member 14 is 100, it would be desirable that the adsorptive force of magnets 12 is larger than 3 gf×100=300 gf.

For an exemplary case where neodymium magnets, each having a diameter of 3 mm and a height of 3 mm, are disposed on four corners of the semiconductor package base 11, the adsorptive force of magnet 12 is as large as 350 gf×4=1400 gf, exceeding 300 gf, so that the necessary condition is satisfied. Similarly, for the case of samarium-cobalt magnet, the value is given as 150 gf×4=600 gf, again the necessary condition is satisfied.

The magnets 22 are disposed to be exposed to the surface of the semiconductor package base 21 or to be buried in the semiconductor package base 11, so as to adsorb the magnets 12 disposed on the semiconductor package base 11. The magnets 22 are disposed in such a manner that the magnetic pole different from the pole of the magnets 12 on a side of the surface contacting the semiconductor package base 21 in the semiconductor package base 11, is directed toward the direction of a side of the surface contacting the semiconductor package base 11 in the semiconductor package base 21. By adsorption between the magnets 12 and the magnets 22, the semiconductor package base 21 is stacked on the semiconductor package base 11, and thereby connection between the contact points 13 formed on the semiconductor package base 11 and pads (not shown) formed on the semiconductor package base 21 is made reliable. The semiconductor package base 11 and the semiconductor package base 21 are fixed not in such a way of using solder, whereby the connection and disconnection between the semiconductor package base 11 and the semiconductor package base 21 are readily performed.

So far as the contact points 13 formed on the semiconductor package base 11 and the pads (not shown) formed on the semiconductor package base 21 are made to as large enough as allowing them to contact with each other, by virtue of alignment accuracy based on a self-alignment effect of the magnets 12 and the magnets 22, the semiconductor package 10 and the semiconductor package 20 may successfully be aligned only by contribution of the self-alignment effect of the magnets 12 and the magnets 22. The "self-alignment effect" used herein means that the semiconductor package 10 and the semiconductor package 20 is aligned by a magnetic force of the magnets.

The magnets, forming a certain range of magnetic field therearound, will not adversely affect signal transmission and reception among the mount components 15. Alternatively, the magnets may be used also as terminals, in the case of being composed of an electro-conductive material such as cobalt-containing material.

The contact points 13 electrically connect the semiconductor package 10 with the semiconductor package 20. The contact points 13 are connected to the elastic member 14 and interconnections (not shown). Through the contact points, a power supply is provided to the mount components 15 on the semiconductor package base 11, and signals from the mount components 15 on the semiconductor package 10 is transmitted to the semiconductor package 20 and the semiconductor package 10 receives signals from the semiconductor package 20.

The contact points 13 are composed of an electro-conductive material, for example, a gold-plated metal material. An appropriate number of contact points 13 are disposed, in consideration of type of power supply, current capacity, and power consumption by the mount components 15. The heads of the contact points 13 are formed to be projected out from the surface of the semiconductor package base 11 in the normal state.

The elastic member 14 are connected to the contact points 13, and are provided in elastic member housings H formed in the semiconductor package base 11. As described above, the heads of the contact points 13 in the normal state are projected out from the surface of the semiconductor package base 11, but are pushed back into the elastic member housings H when the semiconductor package base 21 is stacked on the semiconductor package base 11. The contact points 13 in this state are pressed against the semiconductor package base 11 by contribution of elastic force of the elastic member 14. Thus, the contact points 13 may be brought into reliable contact with the semiconductor package base 11.

The elastic member 14 may be formed of an arbitrary material having an elastic property. The elastic member 14 are connected to interconnections (not shown) formed on the semiconductor package base 11, and may be used power supply line or the like. Accordingly, the elastic member 14 are preferably composed of an electro-conductive material, and supplies power or signals supplied from the contact points 13 to the semiconductor package base 11. More preferably, the elastic member 14 are metal springs, and may be composed of stainless steel, copper or the like.

The mount components 15 are electronic components such as IC including LSI, resistor, capacitor, and semiconductor elements such as diode. The mount components 15 are mounted on the semiconductor package base 11, to meet application and function requirements of the semiconductor package 10.

Next, the structure of the semiconductor device 1 according to one embodiment of the present invention will be explained.

As shown in FIG. 1, in the semiconductor device 1 according to this embodiment, the semiconductor package 20 is stacked on the semiconductor package 10, by the adsorption force between the magnets 12 and the magnets 22. By contribution of the self-alignment effect of the magnets 12 and the magnets 22, the semiconductor package 10 and the semiconductor package 20 are aligned so that the contact points 13 are brought into contact with the pads (not shown) formed on the semiconductor package 20. The contact points 13 in this state are pressed toward the semiconductor package 20 by the elastic member 14 connected to the contact points 13, and are thereby brought into contact with the pads in a reliable manner.

FIG. 1 shows an exemplary case where the number of semiconductor packages to be stacked is two-layer, wherein three or larger arbitrary number of packages may be stacked. Also in the embodiments described below, the semiconductor packages may be stacked with an arbitrary number.

Next, a method of using the semiconductor device 1 according to this embodiment will be explained.

The semiconductor device 1 according to this embodiment has the semiconductor packages stacked therein by magnetic adsorption, so that the number of semiconductor packages to be stacked is readily increased. As a consequence, for a memory system having mounted therein mount components 15, 25, configured as memories such as flash memories, memory capacity of the semiconductor device 1 may readily be increased. Thus, with the semiconductor device 1 according to this embodiment, a storage system (external storage device) having a variable memory capacity may be provided. By increasing the number of semiconductor packages to be stacked, it may be possible to fabricate even giga-byte to tera-byte memory systems.

The semiconductor device 1 according to this embodiment has the semiconductor packages stacked by magnetic adsorption, so that it is easy to increase the number of the semiconductor packages to be stacked. As a consequence, an exemplary signal processing system having mount components 15, 25, configured as digital signal processing systems for vector calculation, may readily enhance the calculation performance.

Furthermore, when a semiconductor device 1 related to an embodiment of the present invention is, for example, dedicated to television application having mounted therein the mount components 15, 25 configured as signal processing systems for higher quality images, and when a more advanced signal processing system is developed, the former semiconductor package may readily be replaced by a new semiconductor package having more advanced signal processing system mounted thereon. Consequently, the semiconductor package may readily be upgraded.

The semiconductor device according to an embodiment of the present invention is configured that a plurality of semiconductor packages are stacked by magnetic adsorption between the magnets disposed on the semiconductor packages, so that it may be more ready to stack a new semiconductor package, or to replace the semiconductor package. As a consequence, a desired semiconductor device may be obtained, simply by modifying or adding only the semiconductor package portion, without replacing the substrate having the semiconductor devices mounted thereon.

Second Embodiment

Figure 2:
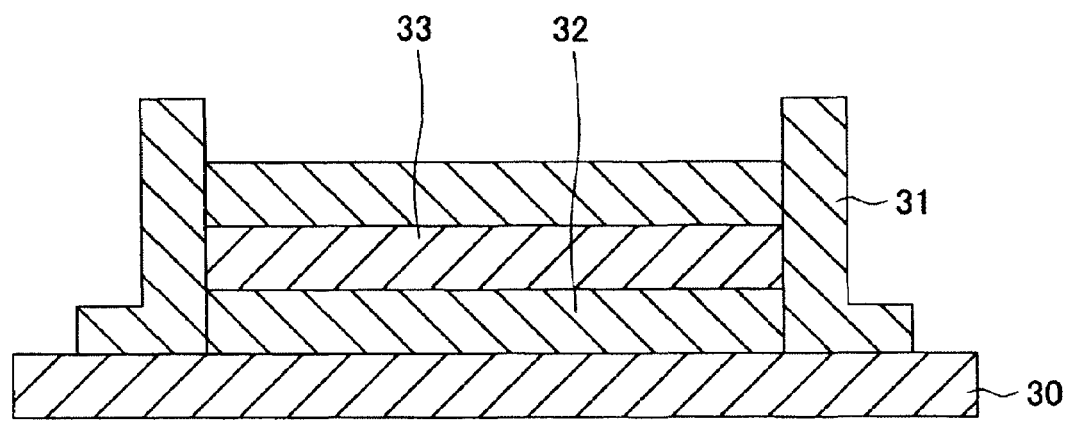
FIG. 2 is a sectional view of a semiconductor device provided with an alignment mechanism aligning the semiconductor packages, according to one embodiment of the present invention.

FIG. 2 is sectional view of a semiconductor device having an alignment mechanism aligning the semiconductor packages, according to one embodiment of the present invention. The structure of the semiconductor packages of this embodiment is same as that shown in the first embodiment, and is not illustrated here for the convenience of showing the alignment mechanism aligning the semiconductor packages, and bonding between the semiconductor mounting substrate and the semiconductor device.

As shown in FIG. 2, the semiconductor device 1 according to one embodiment of the present invention includes a semiconductor mounting substrate 30, a guide 31 and semiconductor packages 32, 33.

The semiconductor mounting substrate 30 is composed of a material similar to that of generally-used substrates, and is, for example, glass epoxy, silicon, or the like. The guide 31 is provided so as to align the contact points and the pads between the semiconductor packages to be stacked. The semiconductor mounting substrate 30 is stacked with the semiconductor package 32.

The guide 31 is provided to the semiconductor mounting substrate 30, and includes an opening having the same size and geometry as those of the semiconductor packages 32, 33. The guide 31 guides position of stacking of the semiconductor packages on the semiconductor mounting substrate 30, and aligns the contact points and the pads between the semiconductor packages. The guide 31 may be composed of an arbitrary material, plastic, ceramic or the like.

Next, the structure of the semiconductor device 1 according to one embodiment of the present invention will be explained.

As shown in FIG. 2, the semiconductor device 1 according to this embodiment has the guide 31 provided on the semiconductor mounting substrate 30. The guide includes an opening having the same size and geometry as those of the semiconductor packages 32, 33. The semiconductor package 32 is stacked on the semiconductor mounting substrate 30 along the guide 31, and the semiconductor package 33 is stacked on the semiconductor package 32 again along the guide 31. Also in this embodiment, the adsorption between the semiconductor packages 32 and 33 is performed by magnets, similarly to as described in the first embodiment.

According to the semiconductor device of this embodiment, provision of the guide to the semiconductor mounting substrate allows reliable contact between the contact points and the pads formed on the semiconductor packages, even if it is not so easy to bring the both into contact in a reliable manner.

A method of bonding the semiconductor package 32 onto the semiconductor mounting substrate 30 is explained. It is to be understood that the method of bonding the semiconductor mounting substrate and the semiconductor package explained below in this embodiment is applicable not only to this embodiment, but also to the cases where the semiconductor package is stacked on the semiconductor mounting substrate in other embodiments.

Figure 3:
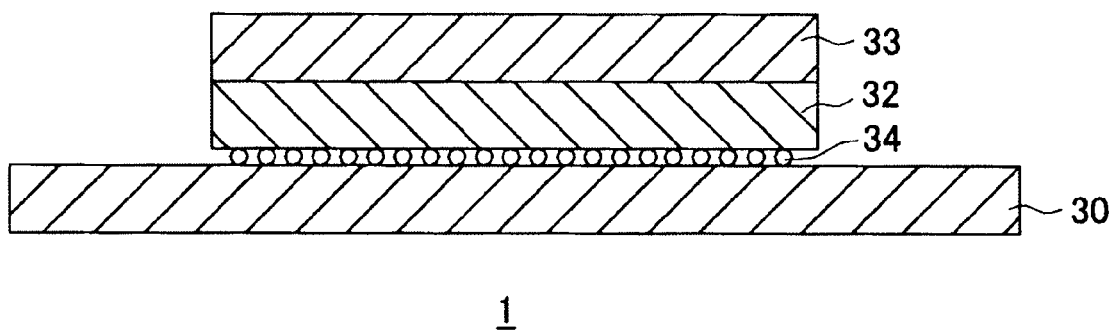
FIG. 3 is a sectional view of a semiconductor device showing bonding using solder balls, according to one embodiment of the present invention.
Figure 4:
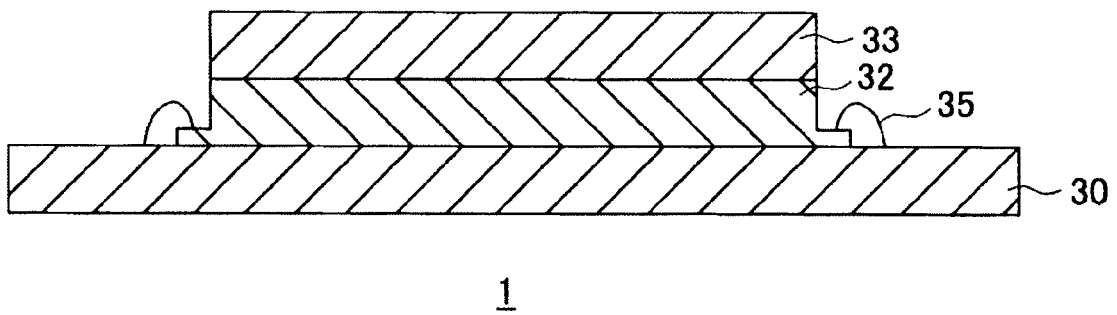
FIG. 4 is a sectional view of a semiconductor device showing bonding through wire bonding, according to one embodiment of the present invention.

FIG. 3 is a sectional view of a semiconductor device showing bonding using solder balls, according to one embodiment of the present invention. FIG. 4 is a sectional view of a semiconductor device showing bonding through wire bonding, according to one embodiment of the present invention.

As shown in FIG. 3, the semiconductor mounting substrate 30 and the semiconductor package 32 are bonded, for example, by spherical low-melting-point metal formed on the semiconductor package 32 specifically on the surface thereof to be faced to the semiconductor mounting substrate 30, more specifically by solder balls 34 arranged in an array of bumps composed of solder or the like. The solder balls 34 allow bonding of the semiconductor mounting substrate 30 and the semiconductor package 32, electrically connection of the semiconductor mounting substrate 30 and the semiconductor package 32, and allow therethrough a supply of power and a transmission/reception of signals.

As shown in FIG. 4, the semiconductor mounting substrate 30 and the semiconductor package 32 may be bonded by wire bonding which allows an electrical connection using very thin electric wires 35. The wires 35 electrically connect the pads on the semiconductor mounting substrate 30 and the pads on the semiconductor package 32.

Third Embodiment

Figure 5:
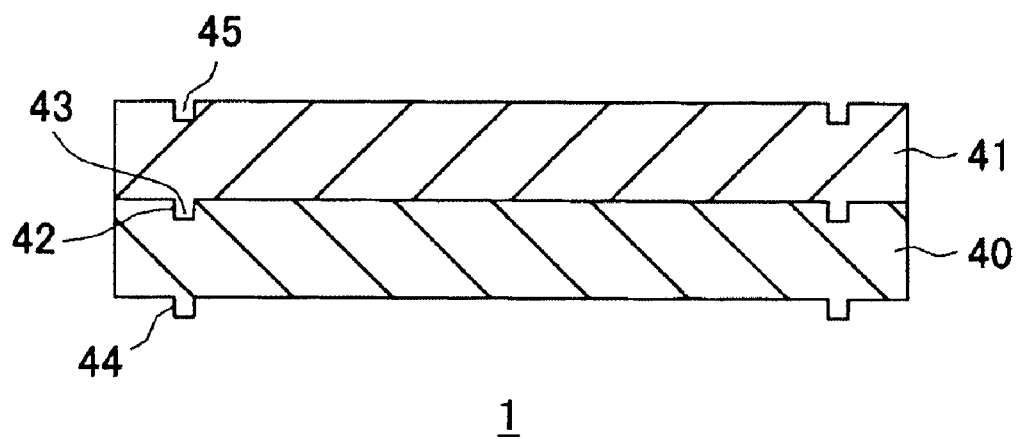
FIG. 5 is a sectional view of a semiconductor device having an alignment mechanism aligning the semiconductor packages, according to one embodiment of the present invention.
Figure 6:
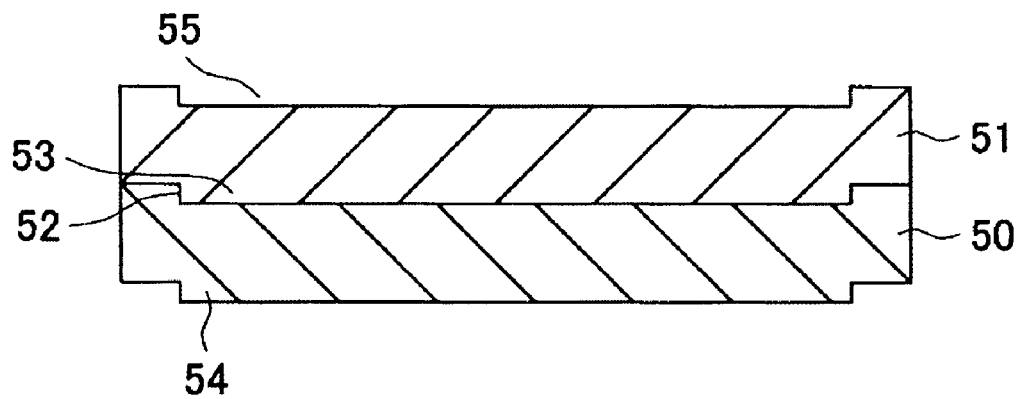
FIG. 6 is a sectional view of a semiconductor device having an alignment mechanism aligning the semiconductor packages, according to one embodiment of the present invention.

FIG. 5 and FIG. 6 are sectional views of semiconductor devices having alignment mechanisms aligning the semiconductor packages, according to one embodiment of the present invention. This embodiment includes alignment mechanisms for the semiconductor packages, different from that shown in the second embodiment, wherein the structures of the semiconductor packages are similar to those of the semiconductor device described in the first embodiment, except that recesses and projections are formed.

As shown in FIG. 5, the semiconductor device 1 according to one embodiment of the present invention includes semiconductor packages 40,41, recesses 42,45, and projections 43,44.

The semiconductor package 40 includes recesses 42 formed on the surface contacting the semiconductor package 41, and includes projections 44 formed on the opposite surface thereof. The semiconductor package 41 includes projections 43 formed on the surface contacting the semiconductor package 40, and includes recesses 45 formed on the opposite surface thereof.

Each recess 42 is, for example, a hole or a trench of approximately 1 mm deep, although variable depending on size and thickness of the semiconductor package 40. Also size of the hole and width of the trench may vary depending on size and thickness of the semiconductor package 40. The hole having a circular geometry may have a diameter of approximately 1 mm, and the hole having a square geometry may have a length of one edge of approximately 1 mm.

In case where the recess 42 is a hole, an arbitrary number of holes may be formed in the semiconductor package 40. More preferably, a plurality of holes are formed so that the semiconductor packages 40 and 41 may be fixed in position. In case where the recess 42 is a trench, a single trench may be formed around the entire circumference of the semiconductor package 40, or a plurality of trenches each having an arbitrary length may be formed.

The projections 43 are formed on the semiconductor package 41 specifically on the surface contacting the semiconductor package 40, to have a geometry for engaging the recesses 42. The projections 43 are formed at positions allowing electrical connection between the contact points and the pads formed on the semiconductor packages 40, 41, when engaged with the recesses 42. By stacking the semiconductor package 41 on the semiconductor package 40 while allowing the recesses 42 and the projections 43 to engage with each other, the contact points and the pads formed on the semiconductor packages 40, 41 may electrically be connected. The recesses 42 and the projections 43 are formed to align the semiconductor package 40 and the semiconductor package 41, so that also in this embodiment, the semiconductor package 41 is stacked on the semiconductor package 40 by adsorption of magnets.

Similarly to as described in the above, the projections 44 on the semiconductor package 40 on the surface opposite to the surface contacting the semiconductor package 41 are formed to be engaged with the recesses on the semiconductor package (not shown). The recesses 45 on the semiconductor package 41 specifically on the surface opposite to the surface contacting the semiconductor package 40 are formed to be engaged with the projections on the semiconductor package not shown.

The semiconductor packages 40, 41 may include recesses having the same size and geometry as those of the recesses 42,45, in place of the projections 43,44. In this case, the semiconductor package 40 and the semiconductor package 41 may be aligned similarly to as described above, by inserting a pin having the same geometry with the projections 43, 44 but approximately twice as long as length of the projection, into the individual recesses.

Next, the structure of the semiconductor device 1 according to one embodiment of the present invention will be explained.

As shown in FIG. 5, in the semiconductor device 1 according to an embodiment of the present invention, the semiconductor package 40 includes the recesses 42 formed on the surface which contacts the semiconductor package 41, and the semiconductor package 41 includes the projections 43 having a geometry for engaging the projections 43, formed on the surface which contacts the semiconductor package 40. The semiconductor package 41 is stacked on the semiconductor package 40, and the semiconductor package 40 and the semiconductor package 41 are then aligned while allowing the recesses 42 to engage the projections 43, so as to bring the contact points (not shown) and the pads (not shown) into contact. Also in this embodiment, adsorption between the semiconductor package 40 and the semiconductor package 41 is made by the magnets, similarly to as described in the first embodiment.

Alternatively as shown in FIG. 6, the semiconductor device 1 according to one embodiment of the present invention includes semiconductor packages 50,51, recesses 52,55, and projections 53,54.

The semiconductor package 50 includes the recess 52 formed on the surface which contacts the semiconductor package 51, and includes the projection 54 on the opposite surface thereof. The semiconductor package 51 includes the projection 53 on the surface which contacts the semiconductor package 50, and includes the recess 55 on the opposite surface thereof.

The recess 52 is, for example, a pit of approximately 1 mm deep, although variable depending on size and thickness of the semiconductor package 50. Also size of the pit may vary depending on size and thickness of the semiconductor package 40. The pit may be formed to be inwardly recessed by 2 to 3 mm from the outer circumference of the semiconductor package 50.

The projection 53 is formed on the semiconductor package 51 on the surface brought into contact with the semiconductor package 50, to be engaged with the recess 52. The projection 53 is formed at a position allowing, when engaged with the recess 52, electrical contact between the contact points (not shown) and the pads (not shown) formed on the semiconductor packages 50, 51. By bringing the semiconductor packages 50 and 51 into contact, while making the recess 52 and the projection 53 engaged with each other, the contact points and the pads formed on the semiconductor packages 50, 51 are electrically connected. The recess 52 and the projection 53 are formed to align the semiconductor package 50 and the semiconductor package 51, so that also in this embodiment, the semiconductor package 51 is stacked on the semiconductor package 50 by adsorption of magnets.

Similarly to as described above, the projection 54 formed on the surface opposite to the surface which contacts the semiconductor package 51 in the semiconductor package 50 is formed to be engaged with the recess on the semiconductor package not shown. The recess 55 formed on the surface opposite to the surface which contacts the semiconductor package 50 in the semiconductor package 51 is formed to be engaged with the projection on the semiconductor package (not shown).

Next, the structure of the semiconductor device 1 according to one embodiment of the present invention will be explained.

As shown in FIG. 6, in the semiconductor device 1 according to this embodiment, the semiconductor package 50 includes the recess 52 formed on the surface which contacts the semiconductor package 51, and the semiconductor package 51 includes the projection 53 having a geometry for engaging the recess 52, formed on the surface which contacts the semiconductor package 50. The semiconductor package 51 is stacked on the semiconductor package 50, and the semiconductor package 50 and the semiconductor package 51 are then aligned while allowing the recess 52 to engage the projection 53, so as to bring the contact points (not shown) and the pads (not shown) into contact. Also in this embodiment, adsorption between the semiconductor package 50 and the semiconductor package 41 is made by the magnets, similarly to as described in the first embodiment.

According to the semiconductor device of this embodiment, by forming the recess and the projection in the semiconductor packages, and by engaging them each other, the contact points and the pads formed on the semiconductor packages may be brought into contact in a reliable manner, even if an alignment accuracy of the self-alignment effect by magnets is not so easy to bring them into contact.

Fourth Embodiment

Figure 7A:
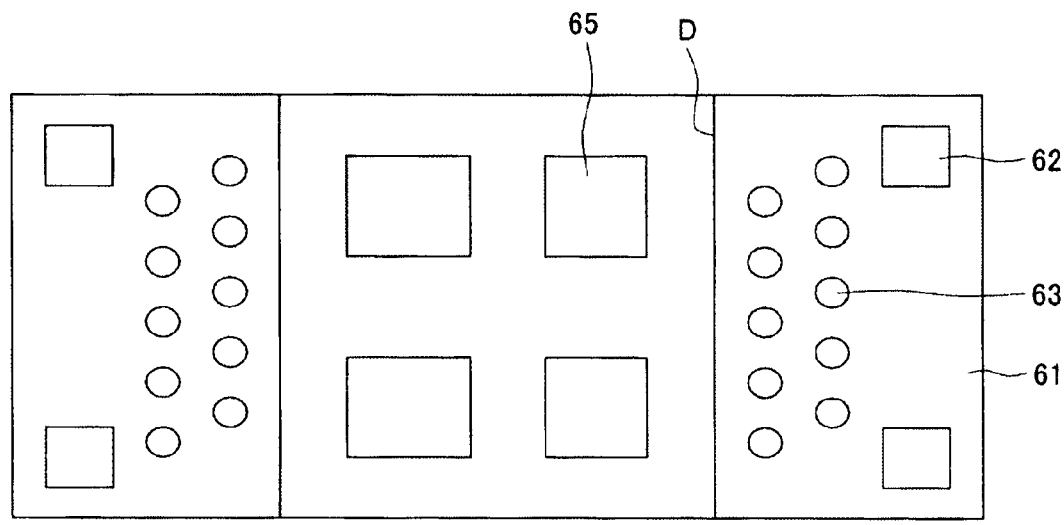
FIGS. 7A and 7B are a plan view and a sectional view, respectively, of a semiconductor device provided with a heat radiation mechanism, according to one embodiment of the present invention.
Figure 7B:
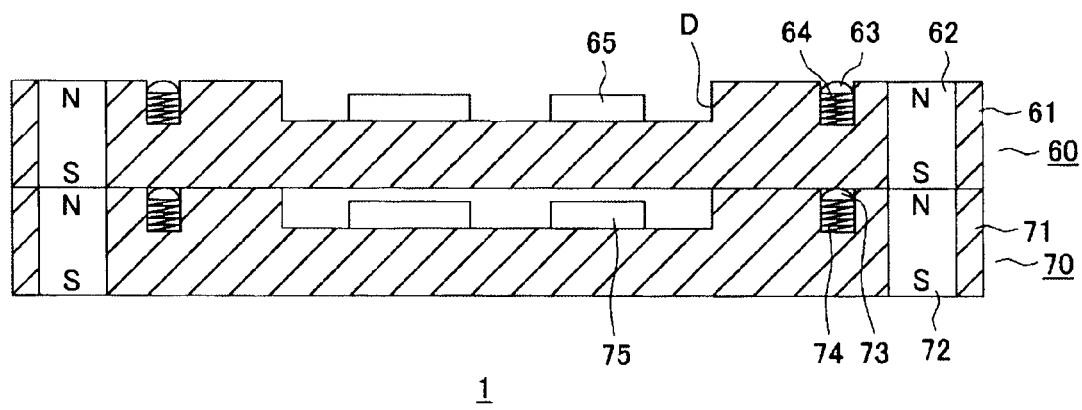
Figure 8A:
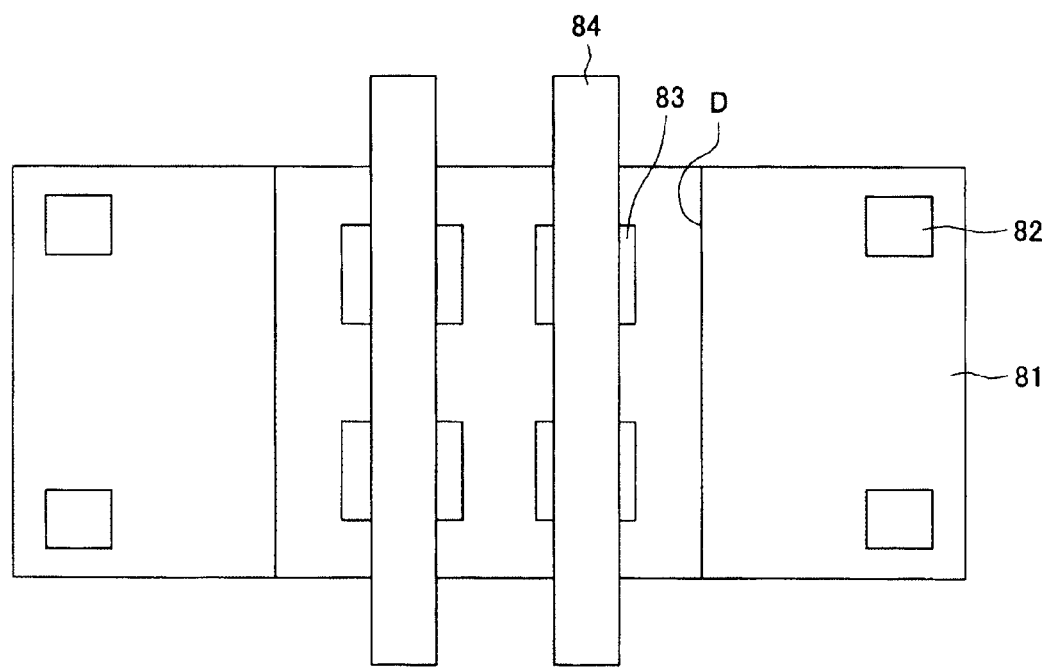
FIGS. 8A and 8B are a plan view and a sectional view, respectively, of a semiconductor device provided with a heat radiation mechanism, according to one embodiment of the present invention.
Figure 8B:
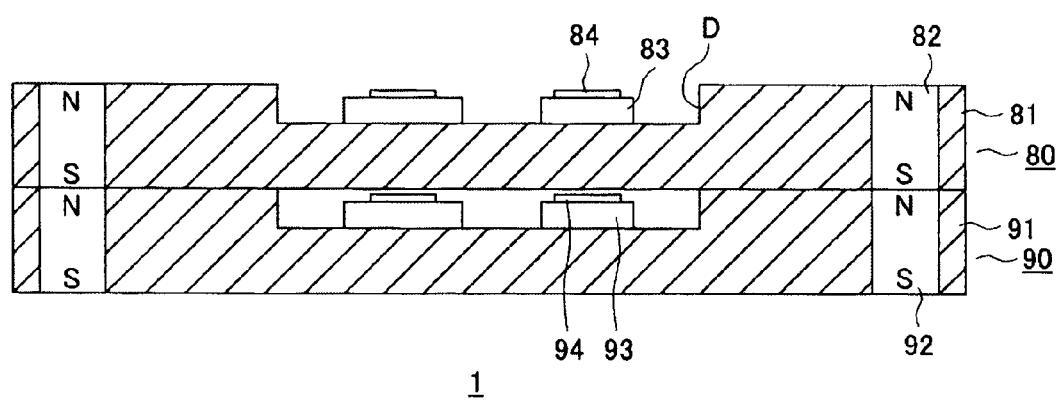
Figure 9A:
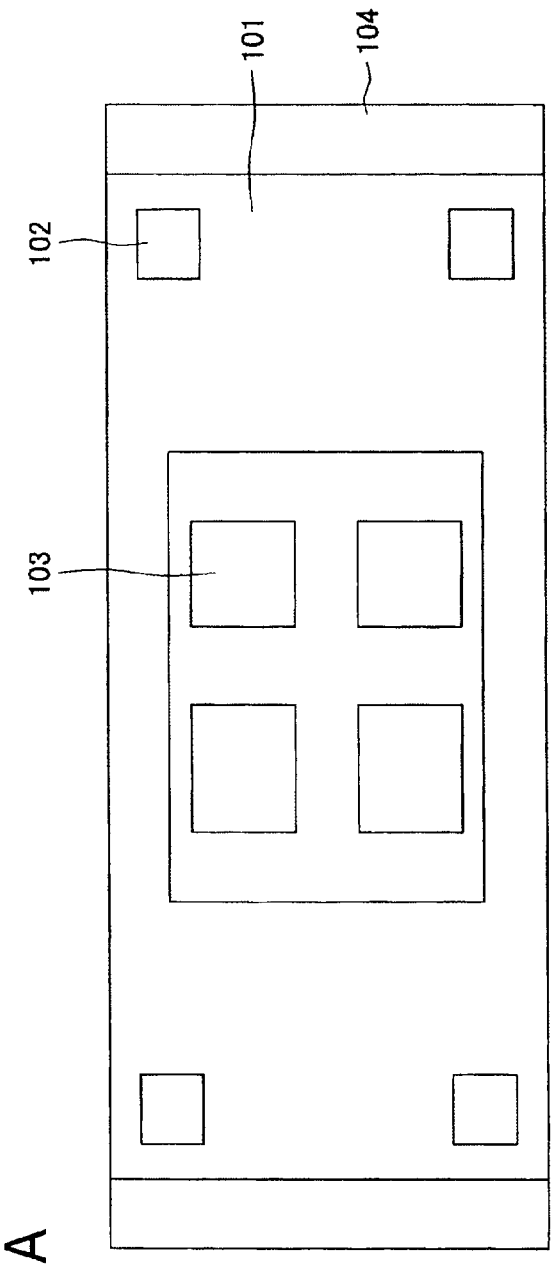
FIGS. 9A and 9B are a plan view and a sectional view, respectively, of a semiconductor device provided with a heat radiation mechanism, according to one embodiment of the present invention.
Figure 9B:
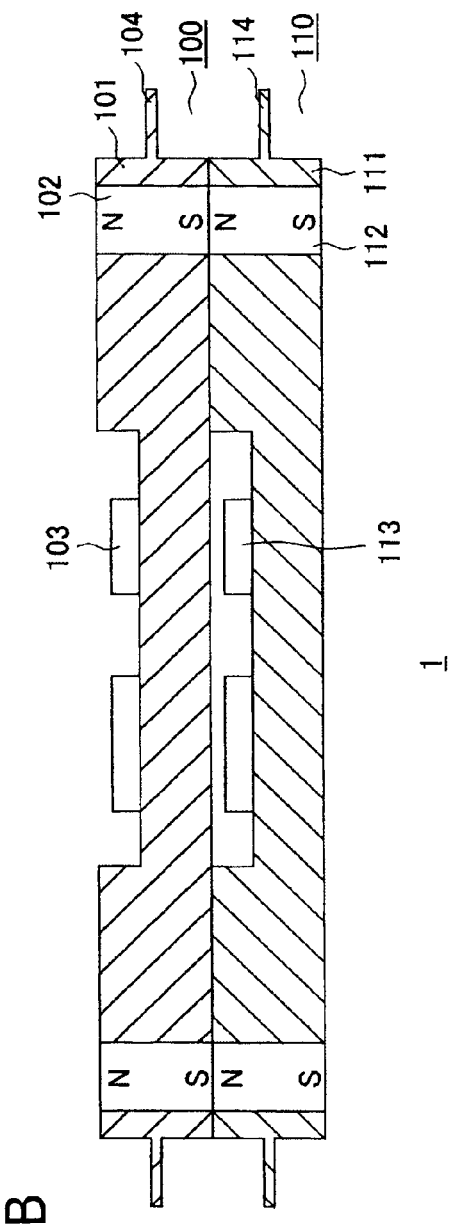

FIGs. FIGS. 7A, 7B, FIGS. 8A and 8B, and FIGS. 9A and 9B are plan views and sectional views of semiconductor devices provided with heat radiation mechanisms, according to one embodiment of the present invention. The structures of the semiconductor packages are same as those in the semiconductor device in the first embodiment. FIG. 7A, FIG. 8A, and FIG. 9A show plan views of the semiconductor devices according to one embodiment of the present invention, and FIG. 7B, FIG. 8B, and FIG. 9B show sectional views of the semiconductor devices according to one embodiment of the present invention.

As shown in FIG. 7, according to one embodiment of the present invention, the semiconductor device 1 includes semiconductor packages 60, 70.

The semiconductor package 60 includes a semiconductor package base 61, magnets 62, contact points 63, elastic member 64, and mount components 65. The semiconductor package 70 includes a semiconductor package base 71, magnets 72, contact points 73, elastic member 74, and mount components 75.

As shown in FIGS. 7A and 7B, the semiconductor package base 61 includes a trench D to which the cavity is deformed, by opening two opposite surfaces of the cavity at the center thereof. The mount components 65 are mounted in the trench D. The contact points 63 connected to the elastic member 64 are disposed along two opposing edges of the semiconductor package base 61, while leaving two other edges opened. Heat generated from the mount components 65 is dissipated by air flowing through the trench D.

The semiconductor package 70 is also formed similarly to the semiconductor package 60. The semiconductor package 60 is stacked on the semiconductor package 70. Heat generated from the components 65 is dissipated out from two opposing edges left open, by air flowing through the trench D, similarly to as in the semiconductor package 60, although not radiated from the top surface. Also in this case, the semiconductor packages 60 and 70 adsorb with each other, by magnetic adsorption between the magnets 62 and the magnet 72.

Alternatively as shown in FIGS. 8A and 8B, the semiconductor device 1 according to one embodiment of the present invention includes semiconductor packages 80, 90.

The semiconductor package 80 includes a semiconductor package base 81, magnets 82, mount components 83, and radiating fins 84. The semiconductor package 90 includes a semiconductor package base 91, magnets 92, components 93, and radiating fins 94.

As shown in FIG. 8A, the semiconductor package base 81 includes the trench D to which the cavity is deformed, by opening two opposing surfaces of the cavity. The mount components 83 are mounted in the trench D. A heat radiating fin 84 is provided to component 83 on the surface opposite to the surface faced to the mount surface of the semiconductor package base 81. The semiconductor package base 81 is opened at two opposing edges thereof, and the heat radiating fins 84 are extended to the external of the semiconductor package base 81, so as to dissipate heat generated from the components 83, through the heat radiating fins 84 for dissipating heat to the external, out into the external of the semiconductor package base 81.

The semiconductor package 90 is also formed similarly to the semiconductor package 80. The semiconductor package 90 is stacked with the semiconductor package 80, wherein heat generated from the components 93 is not radiated from the top surface thereof, so that the mount components 93 are provided with the heat radiating fins 94. The semiconductor package base 91 is opened at two opposing edges, and the heat radiating fins 94 are extended to the external of the semiconductor package base 91, so as to dissipate heat generated from the components 93 through the heat radiating fins 94 out into the external of the semiconductor package base 91. Also in this case, the semiconductor packages 80 and 90 adsorb with each other, by the magnets 82 and the magnets 92.

Alternatively as shown in FIGS. 9A and 9B, the semiconductor device 1 according to one embodiment of the present invention includes semiconductor packages 100, 110.

The semiconductor package 100 includes a semiconductor package base 101, magnets 102, mount components 103, and radiating fins 84. The semiconductor package 110 includes a semiconductor package base 111, magnets 112, mount components 113, and radiating fins 114.

As shown in FIGS. 9A and 9B, the semiconductor package base 101 is composed of an arbitrary material, and composed of resin such as glass epoxy, or other materials such as silicon, ceramic or the like. More preferably, material having a high heat conductivity, such as silicon, ceramic or the like, may be used. The cavity is formed at the center of the semiconductor package base 101, and the mount components 103 are formed in the cavity. The semiconductor package base 101 is provided with heat radiating fins 104. Heat generated from the mount components 103 is dissipated through the semiconductor package base 101 and the heat radiating fins 104 out into the external of the semiconductor package base 101.

The semiconductor package 110 is formed similarly to the semiconductor package 100, wherein heat generated from the components 113 is dissipated through the semiconductor package base 111 and the heat radiating fins 114 out into the external of the semiconductor package base 111. Also in this case, the semiconductor packages 100 and 110 are adsorbed to each other, by magnetic adsorption between the magnets 102 and the magnet 112.

According to the semiconductor device of this embodiment, heat generated from the components mounted in the semiconductor package may successfully be dissipated out into the external of the semiconductor package.

Fifth Embodiment

Figure 10A:
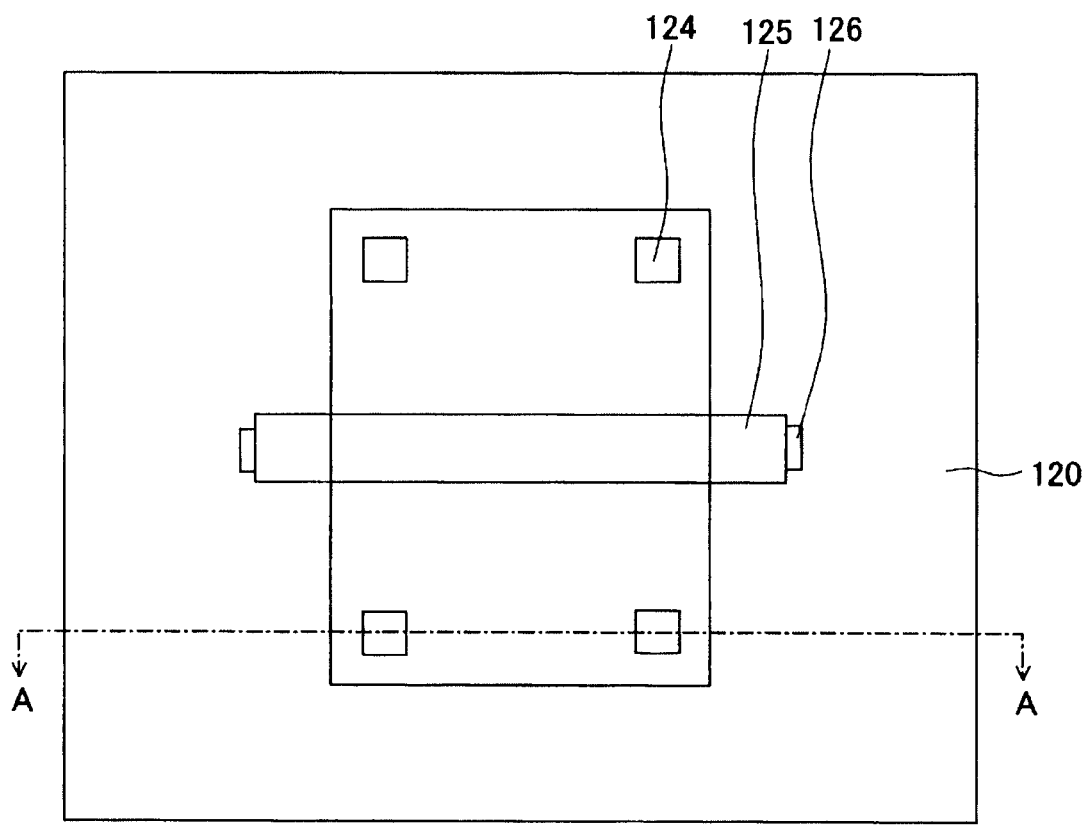
FIGS. 10A and 10B are a plan view and a sectional view, respectively, of a semiconductor device provided with a fall-prevention mechanism for the semiconductor packages, according to one embodiment of the present invention.
Figure 10B:
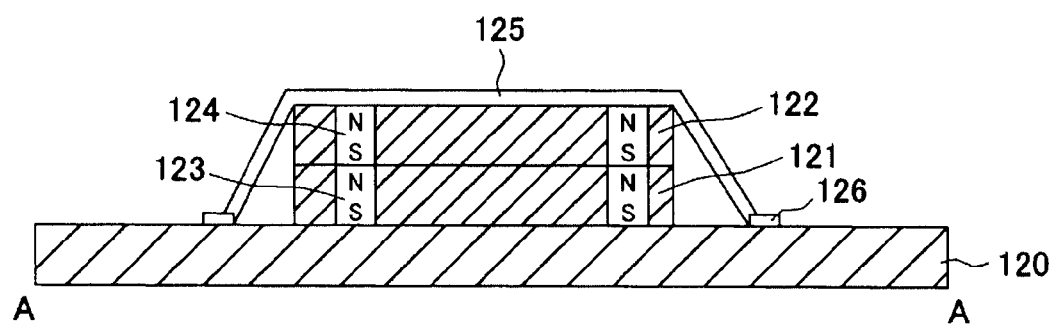
Figure 11A:
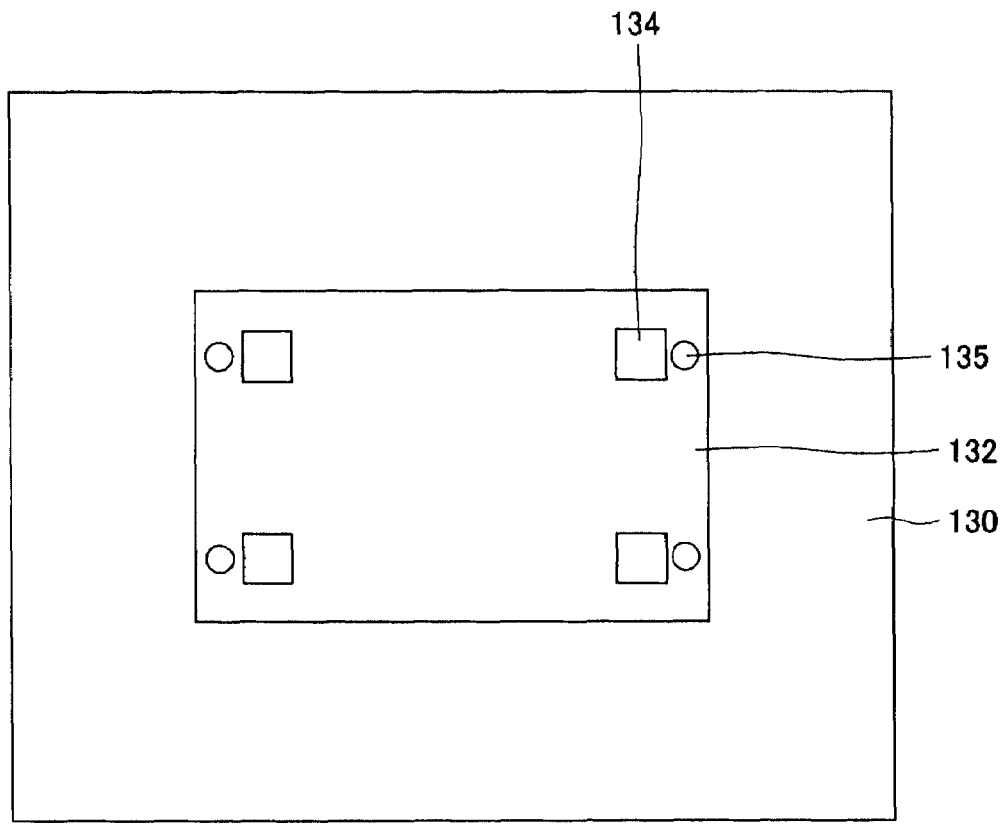
FIGS. 11A and 11B are a plan view and a sectional view, respectively, of a semiconductor device provided with a fall-prevention mechanism for the semiconductor packages, according to one embodiment of the present invention.
Figure 11B:
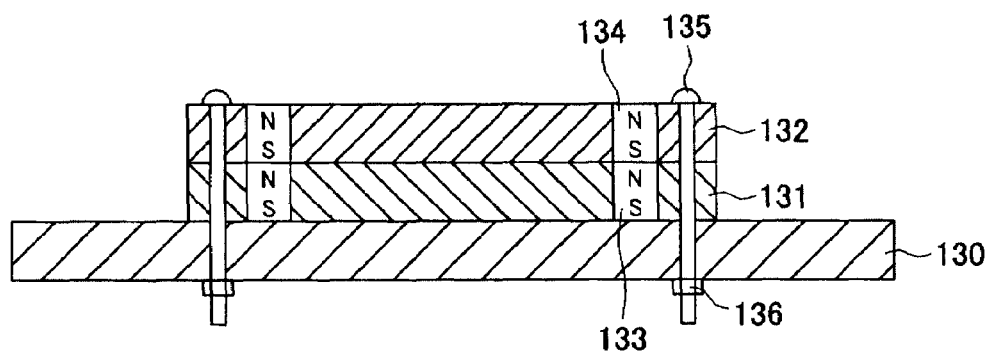

FIGS. 10A, 10B and FIGS. 11A, 11B are plan views and sectional views of semiconductor devices provided with fall-prevention mechanisms for the semiconductor packages, according to one embodiment of the present invention. FIGS. 10A and 11A show plan views of a semiconductor device according to one embodiment of the present invention, and FIGS. 10B and 11B show sectional views of the semiconductor devices according to one embodiment of the present invention. The semiconductor mounting substrate, the semiconductor packages and the magnets are same as those of the semiconductor device of the first embodiment.

As shown in FIGS. 10A and 10B, the semiconductor device 1 according to one embodiment of the present invention includes a semiconductor mounting substrate 120, semiconductor packages 121 and 122, magnets 123 and 124, a band 125, and fixing members 126.

The band 125 prevents the semiconductor package 121 and the semiconductor package 122 stacked by adsorption between the magnets 123 and the magnets 124, from falling or decomposing. The band 125 is, for example, made of rubber or the like. A single band 125 or a plurality of bands 125 may be provided so far as the semiconductor packages 121, 122 will not fall due to impact. A plurality of bands 125 may be attached to be crossed with each other.

The fixing members 126 are provided on the semiconductor mounting substrate 120 to which the band 125 is fixed. The fixing members 126 may be composed of metal, plastic, or the like.

Next, the structure of the semiconductor device 1 according to one embodiment of the present invention will be explained.

As shown in FIG. 10B, in the semiconductor device 1 of this embodiment, the semiconductor package 121 is stacked on the semiconductor mounting substrate 120, and the semiconductor package 122 is stacked on the semiconductor package 121 semiconductor package 122 by adsorbing the magnets 123 and the magnets 124. The band 125 is attached to the fixing members 126 provided on the semiconductor mounting substrate 120 so as to cover the semiconductor packages 121, 122, and they are fixed.

Alternatively, as shown in FIGS. 11A and 11B, the semiconductor device according to one embodiment of the present invention 1 includes a semiconductor mounting substrate 130, a semiconductor package 131, a semiconductor package 132, magnets 133, magnets 134, machine screws 135, and nuts 136.

The machine screws 135 prevents the semiconductor package 131 and the semiconductor package 132 stacked by adsorption between the magnets 133 and the magnets 134, from falling or decomposing. Length of the machine screws 135 is variably selectable depending, for example, on thickness of the semiconductor mounting substrate 130 and the semiconductor packages 131,132, and the number of semiconductor packages to be stacked on the semiconductor mounting substrate 130. The semiconductor mounting substrate 130, the semiconductor packages 131, 132, and the machine screws 135 may be composed, for example, of metal, plastic and so forth. A single machine screw 135, or an arbitrary number of machine screws 135 may be used. A plurality of machine screws are preferably used.

The nuts 136 fix the semiconductor mounting substrate 130 and the semiconductor packages 131,132, by tightening the machine screws 135. The nuts 136 may be selected from those engageable with the machine screws 135. The nuts may be composed of a material different from that of the machine screws 135, whereas those composed of the same material are preferable.

Next, the structure of the semiconductor device 1 according to one embodiment of the present invention will be explained.

As shown in FIG. 11B, in the semiconductor device 1 according to this embodiment, the semiconductor package 132 is stacked on the semiconductor package 131 by adsorbing the magnets 133 and the magnets 134. The machine screws 135 are placed so as to penetrate the semiconductor mounting substrate 130 and the semiconductor packages 131, 132, and fixed to be tightened into the nuts 136 on the semiconductor mounting substrate 130 on the surface thereof opposite to the surface on which the semiconductor packages 131 are mounted. Because the semiconductor package 131 and the semiconductor package 132 in this case are allowed to adsorb by the magnets 133 and the magnets 134, the machine screws 135 may readily be attached and detached, thereby improving working efficiency.

Since the semiconductor package 131 and the semiconductor package 132 are adsorbed by the magnets 133 and the magnets 134, the machine screws 135 may be used for alignment between the semiconductor package 131 and the semiconductor package 132, without tightening the machine screws 135 and the nuts 136.

According to the semiconductor device of this embodiment, the semiconductor packages mounted on the semiconductor substrate may be prevented from falling or decomposing due to impact.

Sixth Embodiment

Figure 12:
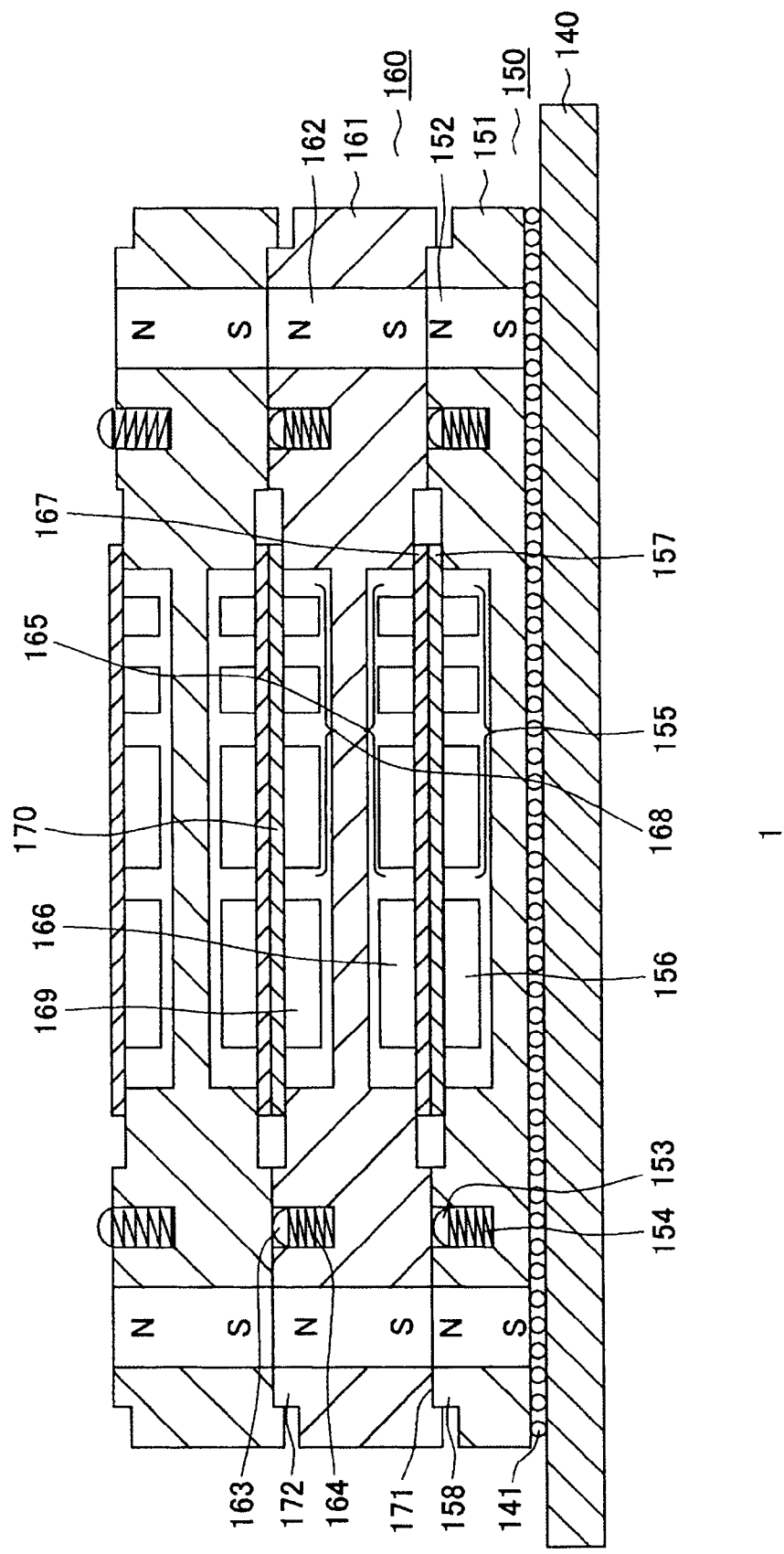
FIG. 12 is a sectional view showing an exemplary application of the semiconductor device according to one embodiment of the present invention.

FIG. 12 is a sectional view of an applied example of a semiconductor device according to one embodiment of the present invention.

As shown in FIG. 12, the semiconductor device 1 according to one embodiment of the present invention includes a semiconductor substrate 140, solder balls 141, and semiconductor packages 150, 160.

The semiconductor package 150 includes a semiconductor package base 151, magnets 152, contact points 153, elastic member 154, mount components 155,156, a silicon interposer 157, and a projection 158. The semiconductor package 160 includes a semiconductor package base 161, magnets 162, contact points 163, elastic member 164, mount components 165, 166, 168, and 169, a silicon interposers 167,170, a recess 171, and a projection 172.

In the semiconductor device 1 of this embodiment, any constituents commonly used in the semiconductor device 1 of any other embodiments will not be explained.

The semiconductor package 160 includes cavities formed at the centers of both surfaces on which other packages are to be stacked, in which the components 165, 166, 168, 169 are mounted. In the cavities, the components 165, 166, 168, 169 mounted on the silicon interposers 167,170 are mounted. In order to protect the interior of the cavities, portions where the silicon interposers 167, 170 come into contact with the semiconductor package 160 may be sealed. Alternatively, the cavity may be filled with silicon, for example, to protect the mount components 165, 166, 168, 169 mounted on the silicon interposers.

The mount components 155, 165, 168 are electronic components such as IC including system LSI, resistor, capacitor, and semiconductor elements such as diode.

The mount components 156, 166, 169 are LSIs for wireless communication, wherein signals are transmitted/received between the mount components 156 and 166. The mount component 169 performs wireless signal transmission and reception, to and from the LSIs for wireless communication mounted on the semiconductor packages stacked on the semiconductor package 160.

The silicon interposers 157, 167, 170 are composed of silicon, and are re-wiring substrates on which the components are mounted. The thickness thereof is, for example, 100 μm or smaller. The silicon interposers 157, 167, 170 may be improved in physical strength against heat, stretching, shrinkage and so forth, and may consequently have an excellent reliability.

Next, the structure of the semiconductor device 1 according to one embodiment of the present invention will be explained.

As shown in FIG. 12, in the semiconductor device 1 according to this embodiment, the solder balls 141 are formed on the semiconductor package 150 on the surface thereof to be faced, when stacked, to the semiconductor mounting substrate 140, wherein the semiconductor package 150 is stacked on the semiconductor mounting substrate while placing the solder balls 141 in between, and electrically connected. The semiconductor package 160 is then stacked on the semiconductor package 150, by adsorption between the magnets 152 and the magnets 162. By engaging the projection 158 formed on the semiconductor package 150 with the recess 171 formed on the semiconductor package 160, the semiconductor package 160 is stacked at a position allowing the contact points and the pads formed on the semiconductor packages 150, 160 to establish electric contact. Power supply is provided through the contact points and the pads, between the semiconductor packages 150 and 160. In the cavities of the semiconductor package 150 and the semiconductor package 160, antennas for signal transmission/reception are mounted. By stacking the semiconductor package 160 on the semiconductor package 150 while engaging the projection 158 with the recess 171, a certain level of alignment allowing signal transmission/reception through the transmission/reception antennas may be ensured.

According to the semiconductor device of this embodiment, a semiconductor device having a three-dimensional structure, having a plurality of semiconductor packages stacked therein, may be formed.

It should be understood by those skilled in the art that various modifications, combinations, sub-combinations and alternations may occur depending on design requirements and other factors insofar as they are within the scope of the appended claims or equivalents thereof.

What is claimed is:

1. A semiconductor device comprising:
   a first semiconductor package including a first semiconductor package base having a first cavity formed therein, a first mount component mounted in the first cavity, and a first magnet disposed on the first semiconductor package base; and
   a second semiconductor package including a second semiconductor package base having a second cavity formed therein, a second mount component mounted in the second cavity, and a second magnet disposed on the second semiconductor package base so as to adsorb the first magnet,
   wherein the first semiconductor package and the second semiconductor package are stacked by an adsorption of magnetic force between the first magnet and the second magnet.

2. The semiconductor device as claimed in claim 1, wherein the first magnet is formed to penetrate the first semiconductor package base while an end surface of a magnetic pole of the first magnet is directed toward a direction of stacking with other package in the first semiconductor package base.

3. The semiconductor device as claimed in claim 1, wherein the first magnet is formed to be buried in the first semiconductor package base while an end surface of a magnetic pole of the first magnet is directed toward a direction of stacking with other package in the first semiconductor package base.

4. The semiconductor device as claimed in claim 2, wherein the second magnet is formed to penetrate the second semiconductor package base while an end surface of a magnetic pole of the second magnetic is directed toward a direction of stacking with other package in the second semiconductor package base.

5. The semiconductor device as claimed in claim 1, further comprising a contact point provided on a contact surface where the first semiconductor package comes into contact with the second semiconductor package,
   wherein the contact point is connected to an elastic member, and is brought into contact with the second semiconductor package base.

6. The semiconductor device as claimed in claim 5, wherein the contact point provides a power supply between the first semiconductor package and the second semiconductor package.

7. The semiconductor device as claimed in claim 5, wherein the contact point performs a signal transmission and reception between the first semiconductor package and the second semiconductor package.

8. The semiconductor device as claimed in claim 1, wherein the first semiconductor package has a projected electrode formed on a surface opposite to a surface contacting the second semiconductor package, and the first semiconductor package is used by being mounted on a semiconductor substrate through the projected electrode.

9. The semiconductor device as claimed in claim 1, wherein the first semiconductor package is used by being electrically connected to a semiconductor mounting substrate through a wire bonding.

10. The semiconductor device as claimed in claim 1, further comprising a semiconductor mounting substrate on which the first semiconductor package and the second semiconductor package are mounted,
wherein the semiconductor substrate includes a wall-type guide which has an opening having the same size and geometry as those of the first semiconductor package and the second semiconductor package, and
the first semiconductor package and the second semiconductor package are disposed in the opening of the guide.

11. The semiconductor device as claimed in claim 1, wherein the first semiconductor package has a recess formed in a surface contacting the second semiconductor package, and
the second semiconductor package has a projection formed on a surface contacting the first semiconductor package, the projection having a geometry corresponding to that of the recess.

12. The semiconductor device as claimed in claim 11, wherein the recess is a trench, and
the projection has a geometry corresponding to that of the trench.

13. The semiconductor device as claimed in claim 1, further comprising a heat radiation mechanism for dissipating heat generated from the first mount component and the second mount component.

14. The semiconductor device as claimed in claim 13, wherein the heat radiation mechanism is formed on the first mount component and the second mount component, and is a heat radiating fin formed to extend outside the first semiconductor package and the second semiconductor package.

15. The semiconductor device as claimed in claim 13, wherein the first semiconductor package and the second semiconductor package are made of a material having a large heat conduction property, and
the heat radiation mechanism is a heat radiating fin formed on the outer surface of the first and second semiconductor packages.

16. The semiconductor device as claimed in claim 1, further comprising a semiconductor mounting substrate on which the first semiconductor package and the second semiconductor package are mounted,
wherein the first semiconductor package and the second semiconductor package are fixed to the semiconductor mounting substrate using a band.

17. The semiconductor device as claimed in claim 1, further comprising a semiconductor mounting substrate on which the first semiconductor package and the second semiconductor package are mounted,
wherein the first semiconductor package and the second semiconductor package are fixed to the semiconductor mounting substrate using a machine screw penetrating the first and second semiconductor packages.

18. The semiconductor device as claimed in claim 1, wherein the first semiconductor package has a recess formed in a surface contacting the second semiconductor package,
the second semiconductor package has a projection formed on a surface contacting the first semiconductor package so as to engage with the recess,
the second semiconductor package has a third cavity formed in a surface opposite to a surface having the first cavity formed therein, and
the second cavity and the third cavity have a mount component for wireless communication.

\* \* \* \* \*